United States Patent
Luo et al.

(10) Patent No.: US 8,129,242 B2
(45) Date of Patent: Mar. 6, 2012

(54) METHOD OF MANUFACTURING A MEMORY DEVICE

(75) Inventors: Tian-Shuan Luo, Hsinchu (TW); Chun-Pei Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 545 days.

(21) Appl. No.: 11/383,073

(22) Filed: May 12, 2006

(65) Prior Publication Data

US 2007/0264774 A1    Nov. 15, 2007

(51) Int. Cl.
*H01L 21/336* (2006.01)
*H01L 21/302* (2006.01)
*H01L 21/331* (2006.01)
*H01L 21/31* (2006.01)

(52) U.S. Cl. ........ 438/261; 438/264; 438/692; 438/697; 438/743; 438/753; 438/756; 438/787; 257/E21.681

(58) Field of Classification Search .......... 438/257–267, 438/692, 697, 743, 756, 753, 787; 257/E21.681
See application file for complete search history.

(56) References Cited

U.S. PATENT DOCUMENTS

| | | | |
|---|---|---|---|
| 6,248,631 B1 * | 6/2001 | Huang et al. | 438/260 |
| 6,255,172 B1 * | 7/2001 | Huang et al. | 438/266 |
| 6,326,263 B1 * | 12/2001 | Hsieh | 438/257 |
| 6,576,514 B2 * | 6/2003 | Liu et al. | 438/259 |
| 6,682,977 B2 * | 1/2004 | Chang | 438/257 |
| 6,700,146 B2 | 3/2004 | Ito | |
| 6,897,116 B2 | 5/2005 | Lee et al. | |
| 6,919,607 B2 | 7/2005 | Liu et al. | |
| 6,992,349 B2 * | 1/2006 | Lee et al. | 257/324 |
| 2002/0160571 A1 * | 10/2002 | Tseng | 438/257 |
| 2005/0056879 A1 * | 3/2005 | Lee et al. | 257/314 |
| 2005/0279983 A1 * | 12/2005 | Helm et al. | 257/1 |
| 2006/0121673 A1 * | 6/2006 | Lojek | 438/257 |
| 2006/0166438 A1 * | 7/2006 | Servalli et al. | 438/257 |
| 2006/0205136 A1 * | 9/2006 | Tessariol et al. | 438/211 |

* cited by examiner

*Primary Examiner* — Kevin Parendo
(74) *Attorney, Agent, or Firm* — Jianq Chyun IP Office

(57) ABSTRACT

A method of manufacturing a flash memory device having an enhanced gate coupling ratio includes steps of forming a first semiconductor layer on a substrate and forming a semiconductor spacer layer on top of the first semiconductor layer. The semiconductor spacer layer includes a plurality of recesses. The method provides a semiconductor spacer structure which functions to increase the contact area between a floating gate and a control gate of the flash memory device.

20 Claims, 18 Drawing Sheets

| Steps of First Variation 10a | Steps of Second Variation 10b | Steps of Third Variation 10c | Steps of Fourth Variation 10d | Steps of Fifth Variation 10e |
| --- | --- | --- | --- | --- |
| 20 | 20 | 20 | 20 | 20 |
| 30 | 30 | 30 | 30 | 30 |
| 40 | 40 | 40 | 40 | 40 |
| 50 | 50 | 50 | 50 | 50 |
| 60 | 60 | 60 | 60 | 60 |
| 70 | 70 | 70 | 70 | 70 |
| 80 | 80 | 80 | 80 | 80 |
| 90 | 90 | 90 | 90 | 90 |
| 100 | 100 | 100 | 100 | 100 |
| 110 | 110 | 110 | 110 | 110 |
| 130 | 130 | 130 | 130 | 120 |
| 140 | 170 | 140 | 140 | 130 |
| 150 (152) | 180 | 150 (154) | 150 (156) | 140 |
| 160 | 200 | 160 | 190 (190a) | 150 (152) |
| 190 (190a) | 210 | 190 (190a) | 200 | 160 |
| 200 | | 200 | 210 | 190 (190b) |
| 210 | | 210 | | 200 |
| | | | | 210 |

*Fig. 26*

METHOD OF MANUFACTURING A MEMORY DEVICE

BACKGROUND OF THE INVENTION

The present invention relates to semiconductor devices, and more particularly to flash memory devices having an enhanced gate coupling ratio.

Flash memory devices are known in the art. For example, U.S. Pat. No. 6,897,116 (Lee et al., "the '116 patent") discloses an embodiment of a flash memory device having an enhanced gate coupling ratio (GCR). The concept of gate coupling ratio is discussed in the '116 patent, and that discussion is incorporated herein by reference. A method of manufacturing a flash memory device having an enhanced gate coupling ratio which 1) provides greater flexibility of the manufacturing process and 2) does not require reduction of buried drain semiconductor space would be desirable.

BRIEF SUMMARY OF THE INVENTION

Briefly stated, in a first aspect, the present invention is directed to a method of manufacturing a flash memory device including a semiconductor spacer layer in operable contact with a first semiconductor layer to form a floating gate. The method comprises a step of forming the first semiconductor layer. The semiconductor spacer layer is formed, including a plurality of recesses, on top of the first semiconductor layer. An oxide layer is formed on top of the semiconductor spacer layer. The oxide layer is removed to form a semiconductor spacer layer and to expose an interior surface of each of the recesses.

In a second aspect, the present invention is a method of manufacturing a flash memory device comprising a step of providing a plate line in operable contact with a first semiconductor layer to form a floating gate, the plate line having a plurality of recesses, wherein the plate line is fabricated using a wet etching process.

In a third aspect, the present invention is a method of manufacturing a flash memory device comprising a step of providing a semiconductor substrate. A gate oxide layer is formed on the semiconductor substrate. A first semiconductor layer is formed on the gate oxide layer. An insulating layer is formed on the first semiconductor layer. A portion of the insulating layer is removed to expose a portion of the first semiconductor layer. A portion of the first semiconductor layer is removed to expose a portion of the gate oxide layer. Ions are implanted in the substrate to form a plurality of buried drains. A buried drain oxide layer forming a plurality of mesas is provided, each mesa positioned on top of one of the buried drains, and each mesa having an upper surface extending above an upper surface of a remaining portion of the first semiconductor layer. The upper surfaces of the buried drain oxide layer mesas and the insulating layer are polished to form a substantially planar surface. A remainder of the insulating layer is removed to expose an upper surface of the remaining portion of the first semiconductor layer. A semiconductor spacer layer having a generally uniform thickness is formed on top of the upper surfaces of the buried drain oxide layer mesas and the remaining portion of the first semiconductor layer. A plurality of recesses are thus formed above the remaining portion of the first semiconductor layer. An oxide layer is formed on top of the semiconductor spacer layer of sufficient thickness to fill in each of the plurality of recesses. A portion of the oxide layer formed on top of the semiconductor spacer layer is removed to expose a portion of the semiconductor spacer layer, but leaving a remaining portion of the oxide layer within the plurality of recesses. A portion of the semiconductor spacer layer is removed to expose the upper surfaces of the buried drain oxide layer mesas. The remainder of the oxide layer formed on top of the semiconductor spacer layer and a portion of the buried drain oxide layer are removed to expose a remainder of the semiconductor spacer layer, including an interior surface of each of the plurality of recesses, and a portion of the first semiconductor layer. An insulating stacked structure is formed on exposed portions of the buried drain oxide layer, the first semiconductor layer, and the semiconductor spacer layer. A second semiconductor layer is formed on top of the insulating stacked structure.

In a fourth aspect, the invention is a method of manufacturing a flash memory device comprising a step of providing a semiconductor substrate. A gate oxide layer is formed on the semiconductor substrate. A first semiconductor layer is formed on the gate oxide layer. An insulating layer is formed on the first semiconductor layer. A portion of the insulating layer is removed to expose a portion of the first semiconductor layer. A portion of the first semiconductor layer is removed to expose a portion of the gate oxide layer. Ions are implanted in the substrate to form a plurality of buried drains. A plurality of buried drain oxide layer mesas are formed, one mesa on top of each of the buried drains. Each of the plurality of buried drain oxide layer mesas has an upper surface extending above an upper surface of a remaining portion of the first semiconductor layer. The upper surfaces of the buried drain oxide layer mesas and the insulating layer are polished to form a substantially planar surface. A remainder of the insulating layer is removed to expose an upper surface of the remaining portion of the first semiconductor layer. A semiconductor spacer layer having a generally uniform thickness is formed on top of the upper surfaces of the buried drain oxide layer mesas and the remaining portion of the first semiconductor layer, forming a plurality of recesses above the remaining portion of the first semiconductor layer, each recess including an exposed interior surface. A portion of the semiconductor spacer layer is removed to expose the upper surfaces of the plurality of buried drain oxide layer mesas and at least a portion of upper surfaces of the first semiconductor layer. A portion of the buried drain oxide layer is removed to expose a remainder of the semiconductor spacer layer. An insulating stacked structure is formed on the exposed portions of the buried drain oxide layer, the first semiconductor layer, and the semiconductor spacer layer. A second semiconductor layer is formed on top of the insulating stacked structure.

BRIEF DESCRIPTION OF THE SEVERAL VIEWS OF THE DRAWINGS

The foregoing summary as well as the following detailed description of preferred embodiments of the present invention will be better understood when read in conjunction with the appended drawings. For the purpose of illustrating the invention, there are shown in the drawings embodiments which are presently preferred. It is understood, however, that the invention is not limited to the precise arrangements and instrumentalities shown. In the drawings:

FIG. 26 is a table summarizing the manufacturing steps associated with each of the multiple variations of the method of FIG. 1.

DETAILED DESCRIPTION OF THE INVENTION

Figure 1A:
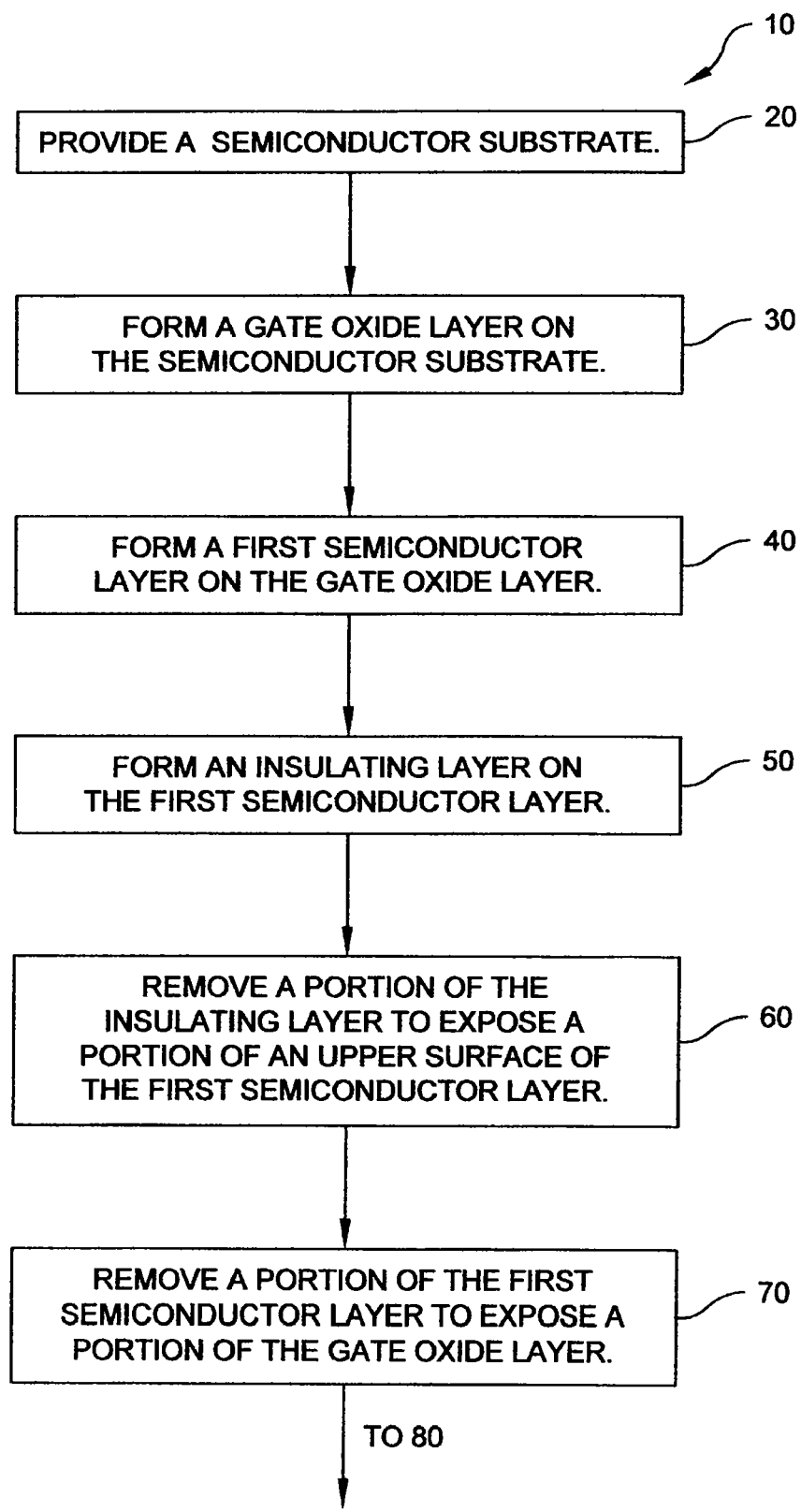
FIGS. 1A-1D are a flow diagram of steps of multiple variations of a method for producing a flash memory device.

Certain terminology is used in the following description for convenience only and is not limiting. The words, "right," "left," "lower" and "upper" designate directions in the drawings to which reference is made. The words "inwardly" and "outwardly" refer to directions toward and away from, respectively, the geometric center of the electrical device power cord storage module and designated parts thereof. The terminology includes the words above specifically mentioned, derivatives thereof and words of similar import. Additionally, the word "a", as used in the specification, means at least one.

Referring to the drawings in detail, wherein like numerals indicate like elements throughout, there is shown in FIGS. 1-26 first through fifth variations 10*a* through 10*e* of a method 10 of manufacturing a flash memory device 300 having an enhanced gate coupling ratio.

FIGS. 2-25 are shown at a scale greatly enlarged from the actual dimensions of the physical embodiment of the flash memory device illustrated. The relative proportions illustrated in FIGS. 2-25 of the various elements is not necessarily representative of the physical proportions of the elements.

With reference to FIGS. 1A-1D, 2-13, and 26, first variation 10*a* of the method 10 is illustrated. Steps of the method 10 are designated as "first", "second", etc. only for convenience in identifying the steps, and such nomenclature is not necessarily indicative of the order in which the steps are performed. With particular reference to FIGS. 1A and 2, the first variation 10*a* of method 10 comprises a first step 20 of providing a semiconductor substrate 320. The substrate 320 may be formed in any number of known, conventional methods, such as float zone monocrystalline growth techniques or Czochralski (CZ) crystal growth techniques. In a second step 30, a tunnel oxide or gate oxide layer 330, is formed on the substrate 320. In a third step 40, a first semiconductor layer 340, preferably polysilicon, is formed on the gate oxide layer 330. Portions of first semiconductor layer 340 ultimately form the floating gate portion of the flash memory device. In a fourth step 50, an insulating layer 350, preferably Silicon Nitride, is formed on the first semiconductor layer 340. Known, conventional materials and methods may be used to form the gate oxide layer 330, the first semiconductor layer 340, and the insulating layer 350.

Figure 3:
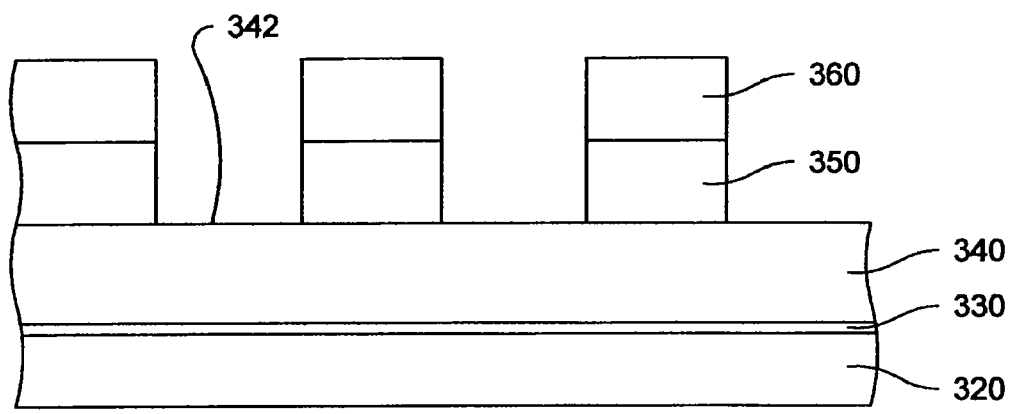
Figure 4:
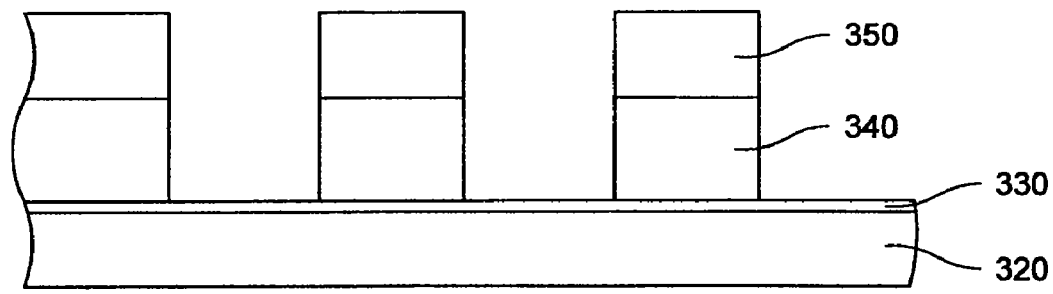

With particular reference to FIGS. 1A and 3, in a fifth step 60, a portion of the insulating layer 350 is removed to expose a portion of an upper surface 342 of the first semiconductor layer 340. Preferably, the insulating layer 350 is removed by a conventional etching process, using a patterned photo resist layer 360, which forms an etch mask. After the portion of the insulating layer 350 has been removed in fifth step 60, the photo resist layer 360 is removed. Once etched, the remaining portion of the insulating layer 350 also forms an etch mask. With reference to FIG. 4, as well as continued reference to FIG. 1A, in a sixth step 70, a portion of the first semiconductor layer 340 is removed to expose a portion of the gate oxide layer 330. Preferably, the portion of the first semiconductor layer 340 is removed using conventional etching techniques well-known to persons of ordinary skill in the art of semiconductor manufacturing processes.

Figure 1B:
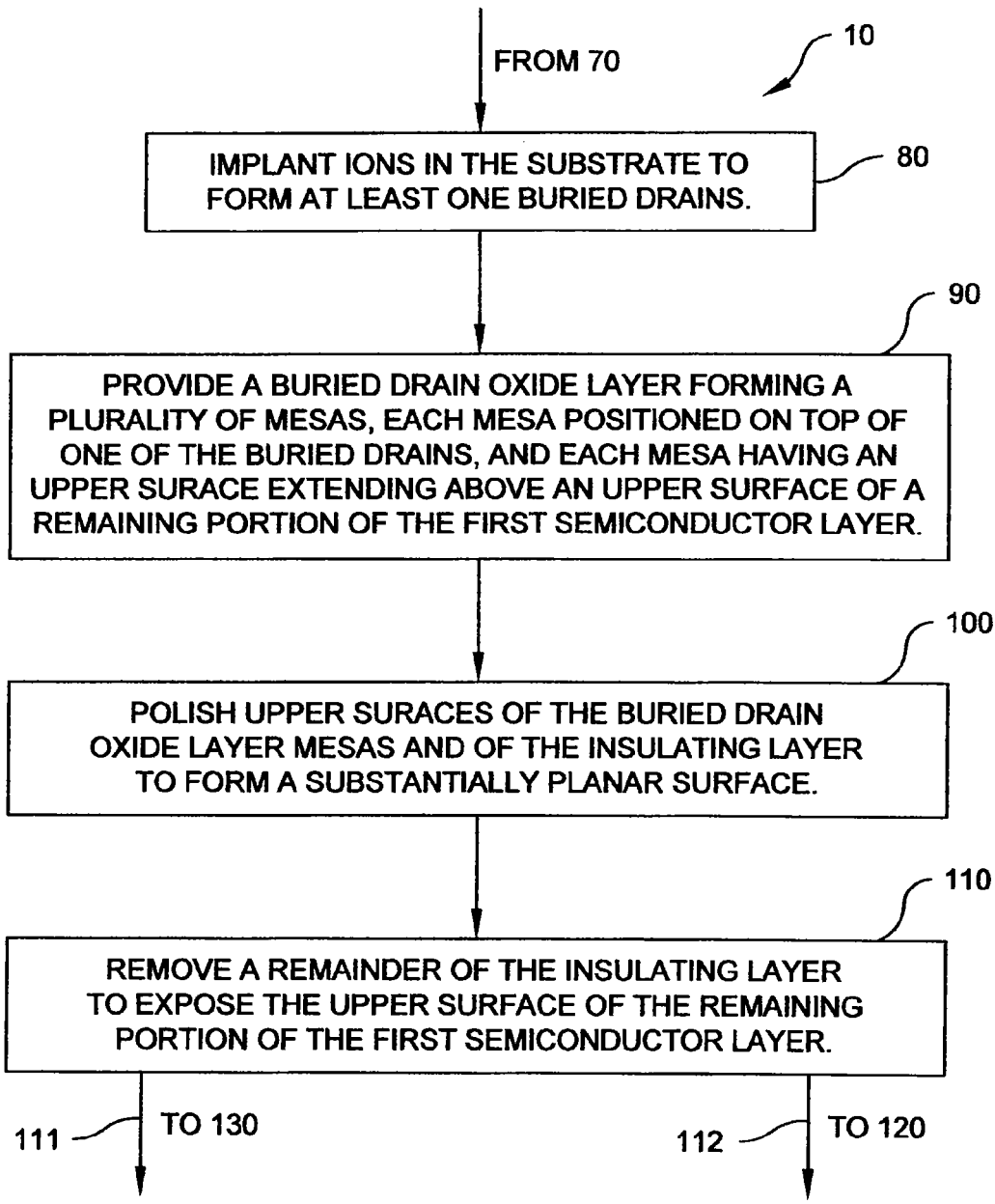
Figure 2:
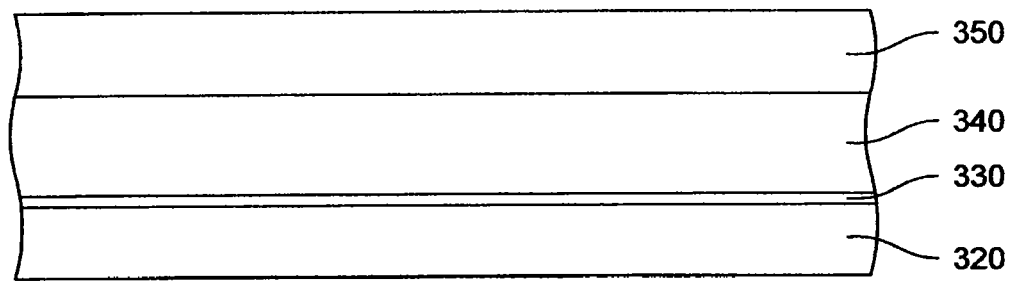
FIGS. 2-13 are schematic cross-sectional views of a flash memory device undergoing a series of progressive manufacturing steps in accordance with a first variation of the method of FIG. 1.
Figure 5:
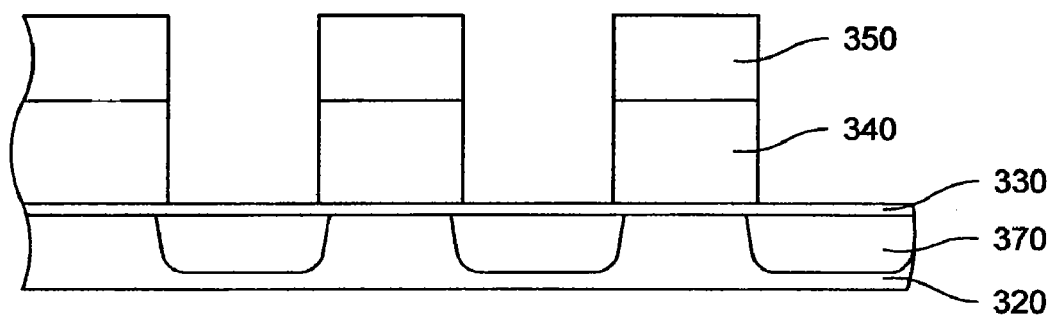
Figure 5A:
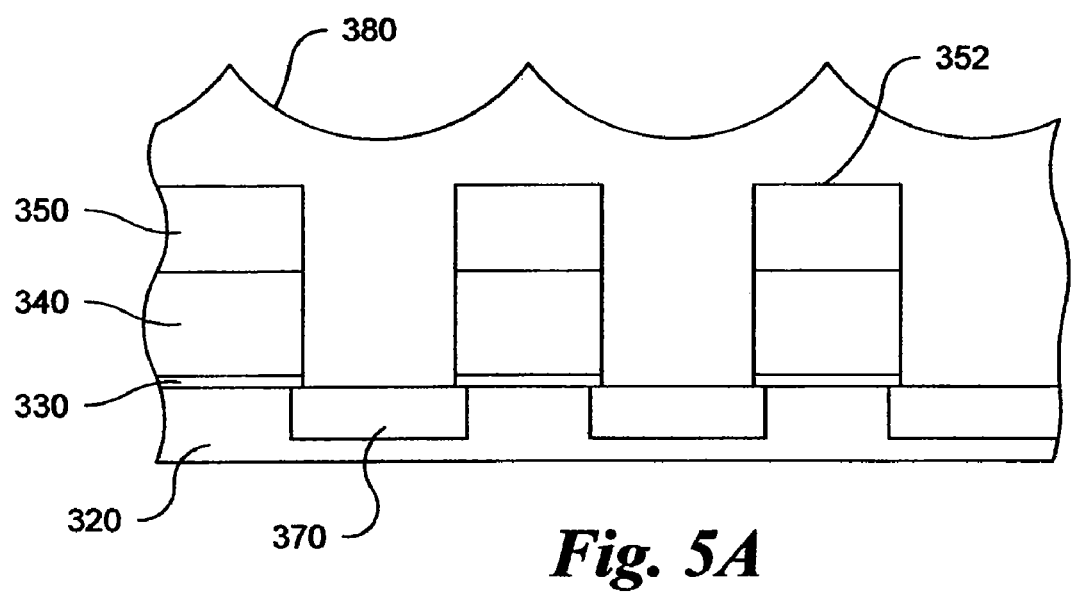
Figure 6:
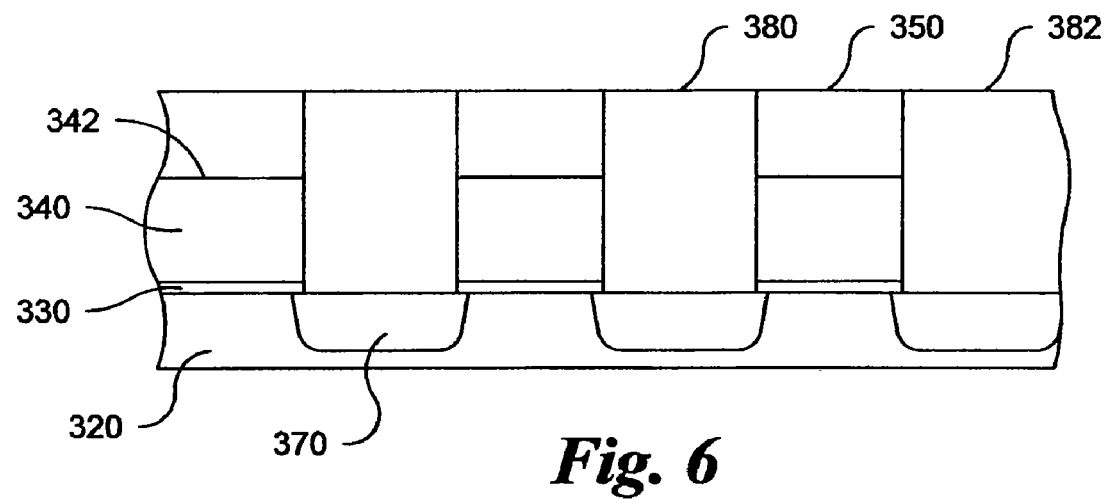
Figure 7:
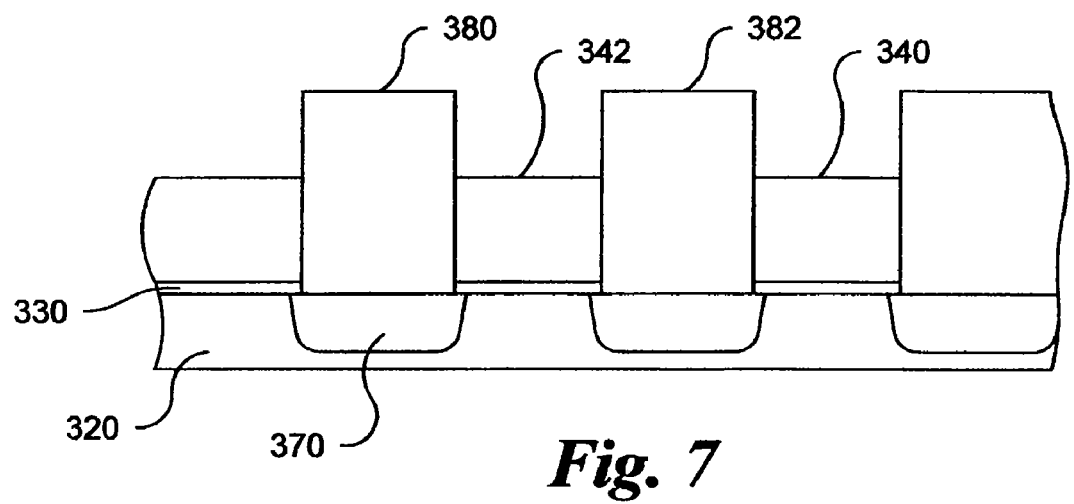

With reference now to FIGS. 1B and 5, in a seventh step 80, using conventional techniques, ions are implanted in the substrate 320 to form at least one, and preferably a plurality of buried drains 370. With reference to FIGS. 1B, 5A, 6, and 7, in an eighth step 90, a buried drain oxide layer 380 is formed on top of the buried drains 370. Preferably, the buried drain oxide layer 380 is formed using conventional techniques such as high density plasma chemical vapor deposition. Following deposition, the buried drain oxide layer 380 covers both the buried drains 370 as well as remaining portions of the first semiconductor layer 340 and the insulating layer 350 (see FIG. 5A). With particular reference to FIG. 6, an upper portion of the buried drain oxide layer 380 is removed, preferably using conventional Chemical-Mechanical Polishing (CMP) techniques or etching back process, to form the buried drain oxide layer 380 into a set of discrete mesas, one mesa formed over each buried drain 370. Preferably, the CMP process removes the upper portion of the buried drain oxide layer 380 to a depth corresponding to an upper surface 352 of the insulating layer. The buried drain oxide layer 380 thus formed has an upper surface or top 382 extending above upper surface or top 342 of a remaining portion of the first semiconductor layer 340. In a preferred ninth step 100, the upper surface of the buried drain oxide layer 380 and the upper surface of a remainder of the insulating layer 350 are polished using conventional techniques, such as conventional CMP techniques to form a substantially planar surface. In a tenth step 110, the remainder of the insulating layer 350 is removed, preferably using conventional etching techniques, to expose the tops 342 of the remaining portion of the first semiconductor layer 340.

Figure 1C:
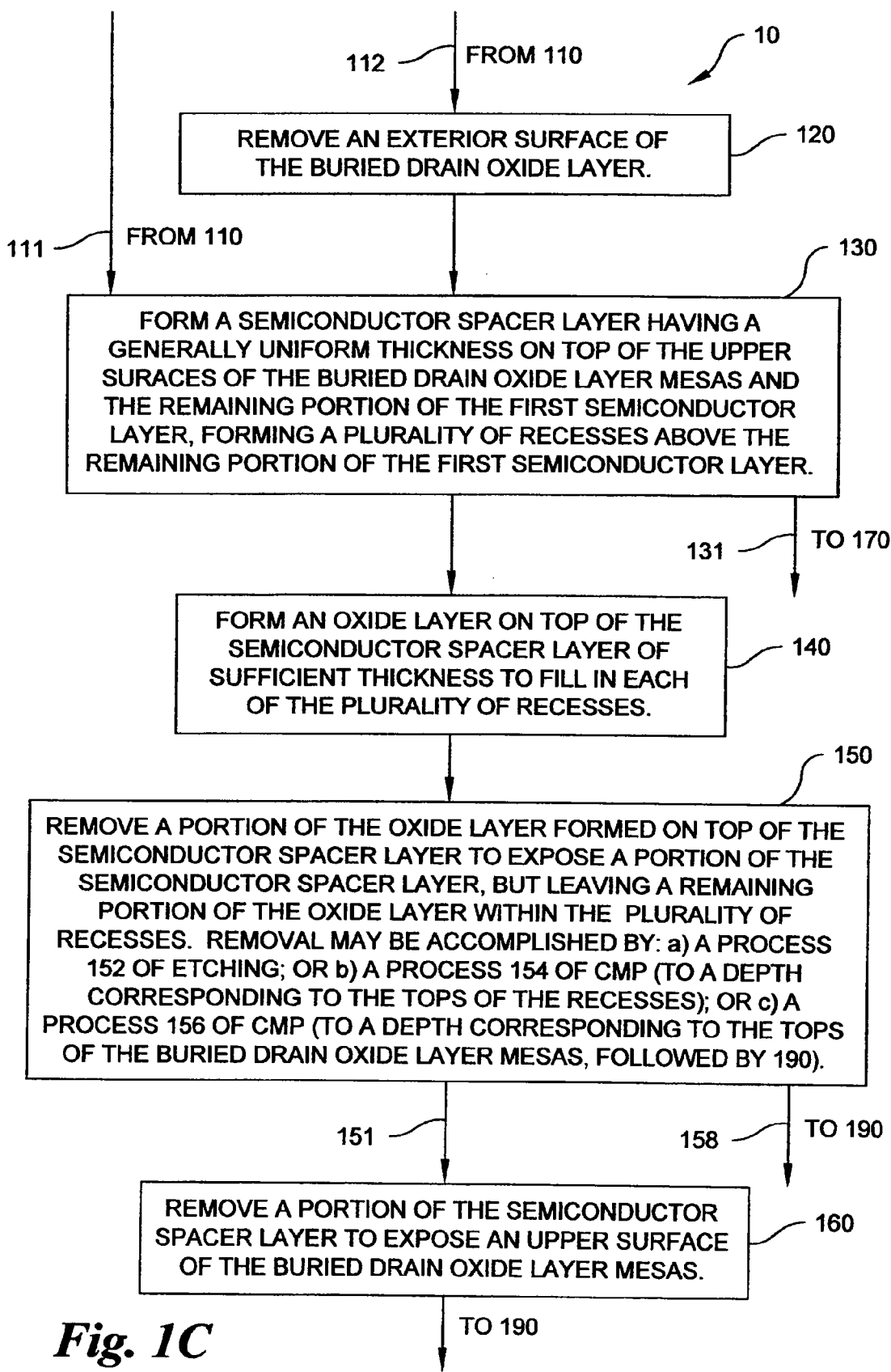
Figure 8:
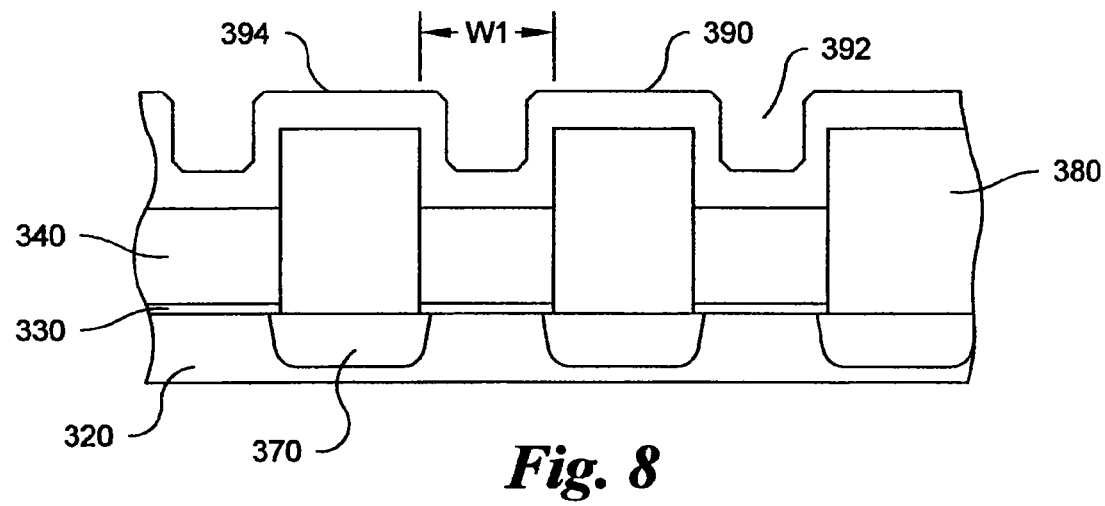

Following tenth step 110, the first variation 10*a* of the method 10 follows path 111 (see FIGS. 1B and 1C) to an eleventh step 130. With reference to FIGS. 1C and FIG. 8, in eleventh step 130, a semiconductor spacer layer 390 is formed. The semiconductor spacer layer 390 has a generally uniform thickness, and extends both on tops 382 and exposed sides of the buried drain oxide layer 380 and the tops 342 of the remaining portion of the first semiconductor layer 340. The semiconductor spacer layer 390 has an upper surface 394. Given the height differential between the tops 382 and the tops 342, and given the at least substantially uniform thickness of the semiconductor spacer layer 390, a plurality of recesses 392 are formed above the tops 342 of the remaining portion of the first semiconductor layer 340. Each recess 392 has a width W1 substantially equal to the spacing between adjacent buried drains 370 and also substantially equal to spacing between adjacent mesas of the buried drain oxide layer 380.

Figure 9:
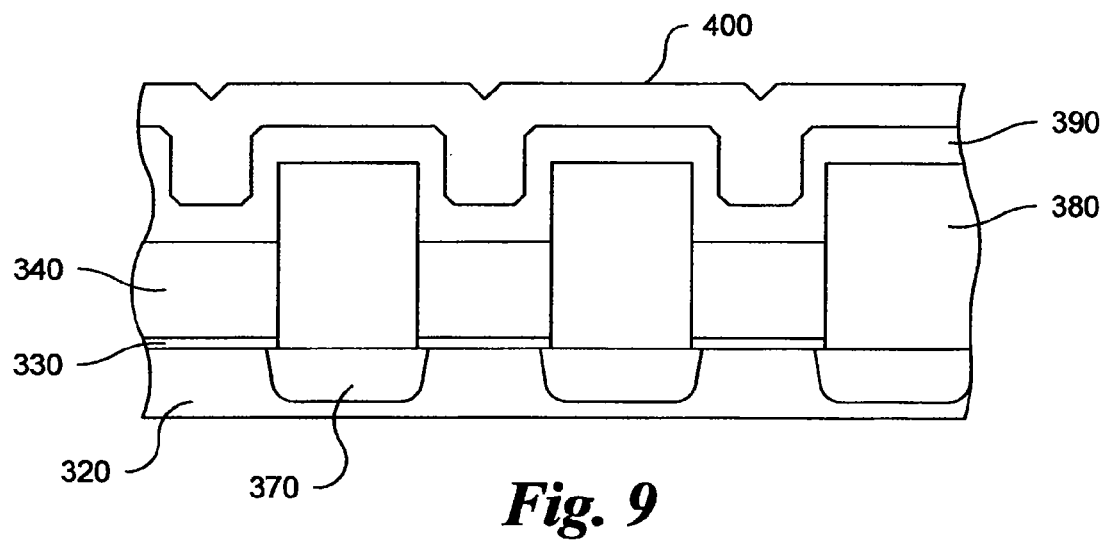
Figure 10:
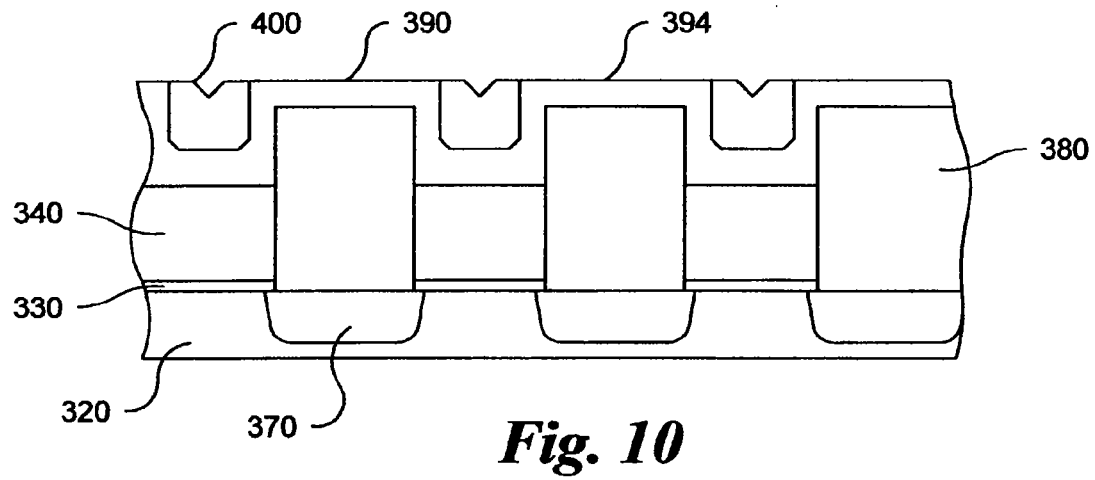

With reference to FIG. 9 and continued reference to FIG. 1C, in a twelfth step 140, an oxide layer 400 is formed on top of the semiconductor spacer layer 390. The oxide layer 400 is provided with a thickness at least sufficient to fill each of the plurality of recesses 392. With reference to FIG. 10, in a thirteenth step 150, a portion of the oxide layer 400 formed on top of the semiconductor spacer layer 390 is removed to expose a portion (preferably upper surface 394) of the semiconductor spacer layer, but leaving a remaining portion 402 of the oxide layer within the plurality of recesses 392. The removal may be accomplished by various methods. In a preferred process incorporated into the first variation 10a of the method 10, the step of removing of a portion of oxide layer 400 is accomplished using a conventional etching process 152.

Figure 1D:
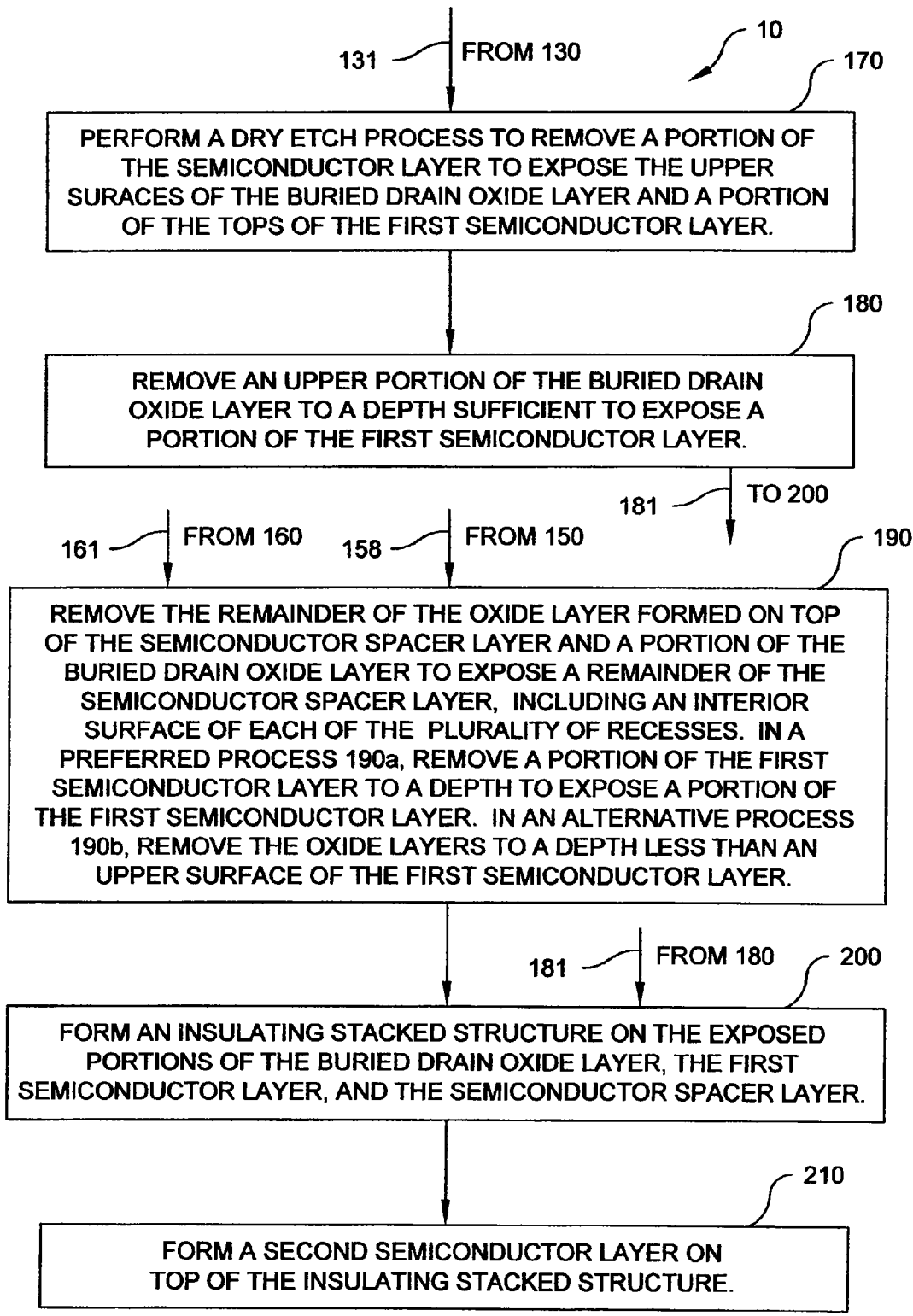
Figure 11:
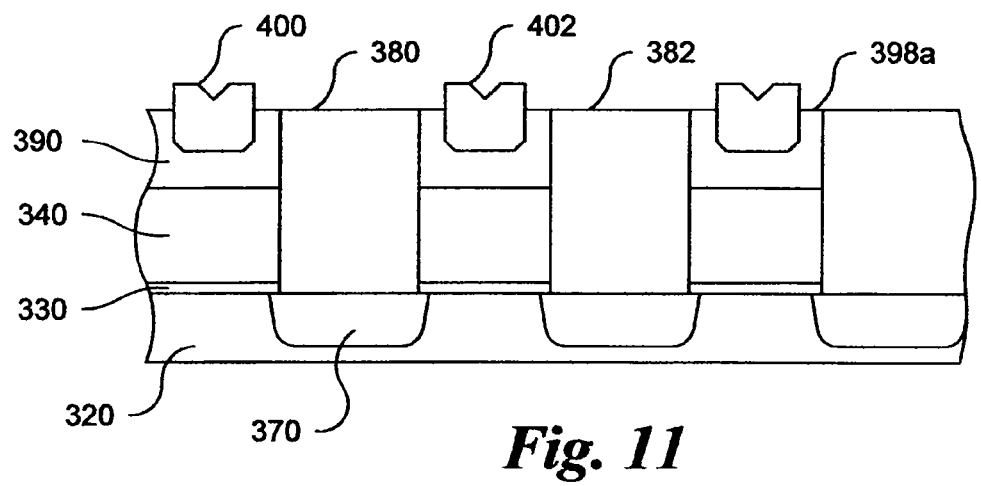
Figure 12:
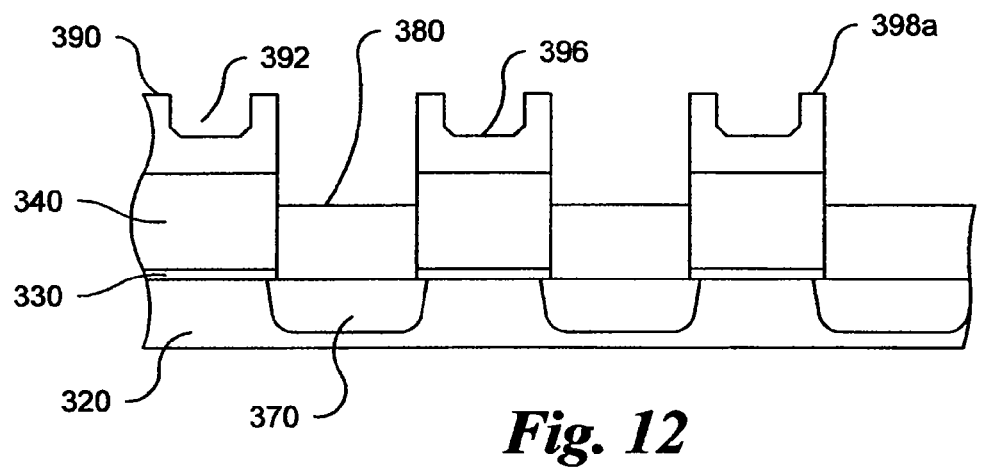

With reference to FIG. 11, in a fourteenth step 160, a portion of the semiconductor spacer layer 390 is removed to expose tops 382 of the buried drain oxide layer 380. A semiconductor spacer structure 398a is thus formed, which acts as a conductive extension of the first semiconductor layer 340. Fourteenth step 160 may be performed using either a conventional wet etching process, or a conventional dry etching process. With reference to FIGS. 1C, 1D, and 12, subsequent to fourteenth step 160, the first variation 10a of method 10 proceeds along path 161 to a fifteenth step 190. In this fifteenth step 190, the remainder of the oxide layer 400 and a portion of the buried drain oxide layer 380 are removed to expose a remainder of the semiconductor spacer layer 390 (semiconductor spacer structure 398a) including an interior surface 396 of each of the plurality of recesses 392. In a preferred variation 190a of fifteenth step 190, upper portions of the buried drain oxide layers 380 are removed to a depth sufficient to expose a portion of the first semiconductor layer 340. The gate coupling ratio obtained may be controlled by controlling the depth to which the buried drain oxide layer 380 is etched. That is, as more of the buried drain oxide layer is removed below the top 342 of the first semiconductor layer, more of the first semiconductor is exposed, increasing the contact area between the floating gate and the control gate, and thus increasing the gate coupling ratio.

Figure 13:
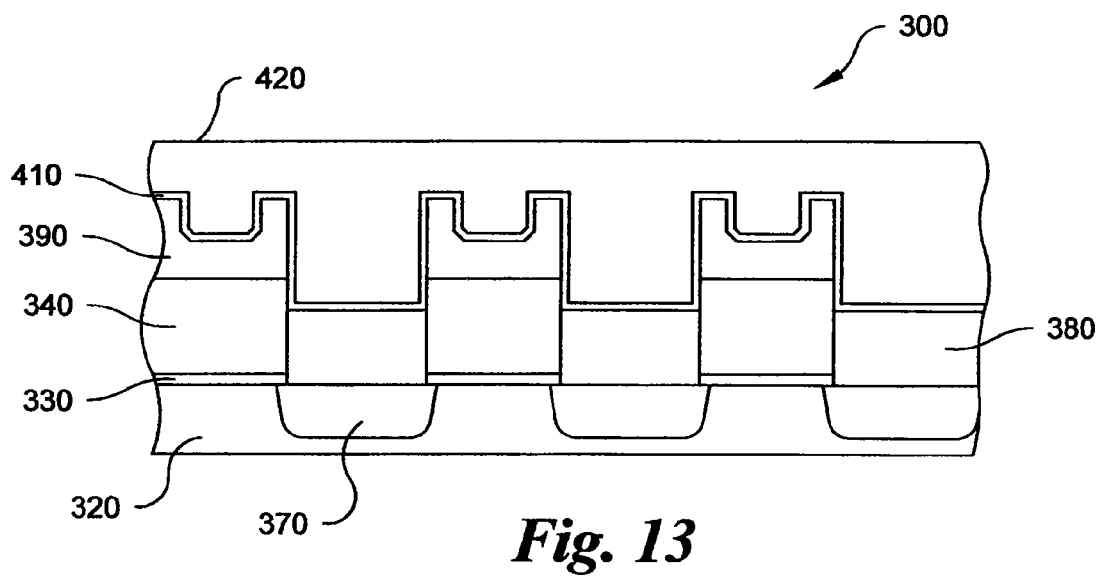

With continued reference to FIG. 1D and with reference also to FIG. 13, in a sixteenth step 200, an insulating stacked structure 410 is formed on the semiconductor spacer structure 398a, exposed surfaces of the buried drain oxide layer 380, and exposed portions of first semiconductor layer 340. The insulating stacked structure 410 is preferably a structure conventionally known in the art as an "ONO" layer. The insulating stacked structure 410 is preferably formed using conventional materials and using conventional techniques well known in the art, and as the insulating stacked structure 410 is conventional, further description is unnecessary and is omitted for brevity. With continued reference to FIG. 13, in a seventeenth step 210, a second semiconductor layer 420 is formed on top of the insulating stacked structure 410. The second semiconductor layer 420 forms a control gate of the flash memory device 300.

With continued reference to FIG. 13, the semiconductor spacer structure 398a significantly increases the effective area in electrical communication between the floating gate (first semiconductor layer 340) and the control gate (second semiconductor layer 420), thus increasing the gate coupling ratio.

Figure 14:
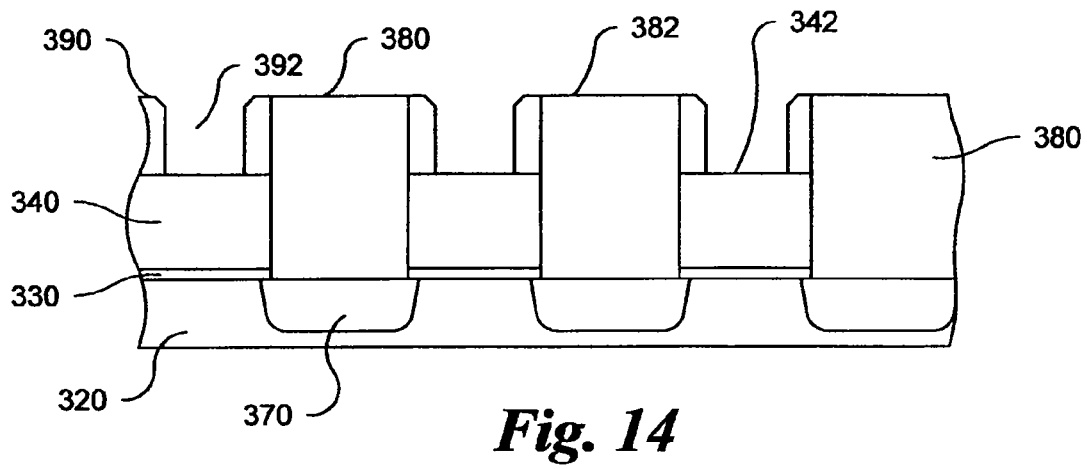
FIGS. 14-16 are schematic cross-sectional views of a flash memory device undergoing a series of progressive manufacturing steps in accordance with a second variation of the method of FIG. 1.
Figure 15:
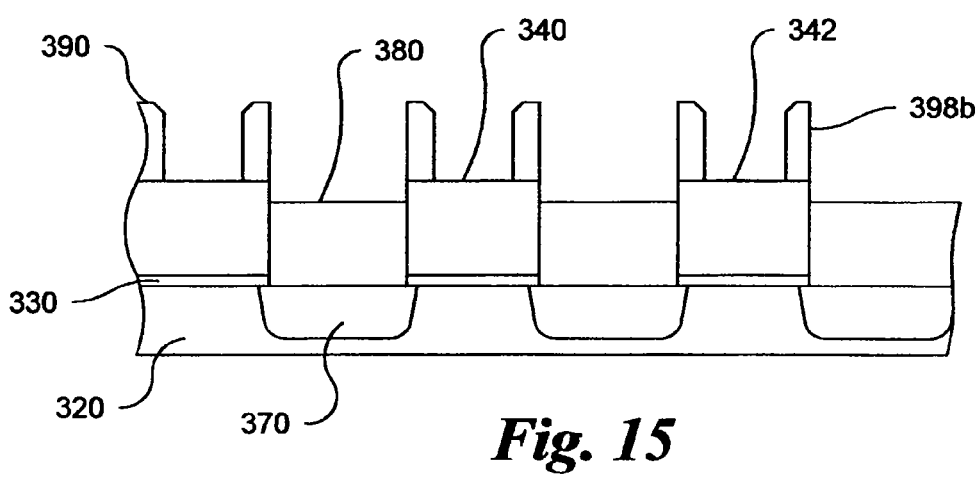
Figure 16:
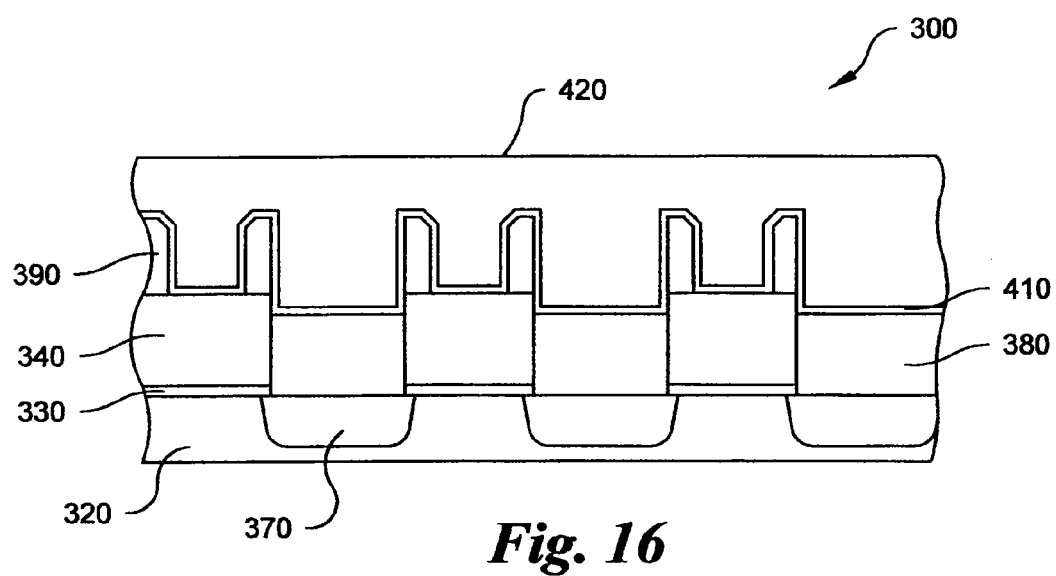
Figure 17:
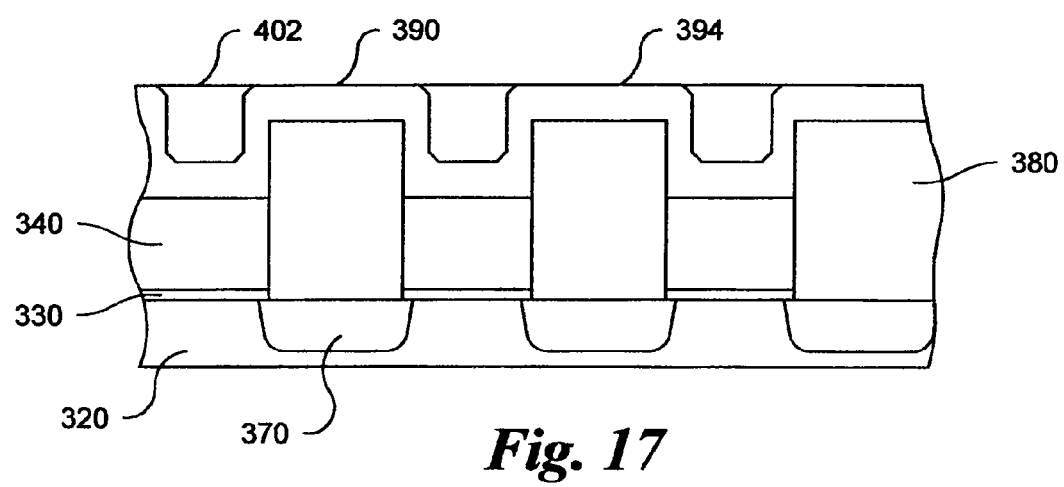
FIGS. 17 and 18 are schematic cross-sectional views of a flash memory device undergoing a series of progressive manufacturing steps in accordance with a third variation of the method of FIG. 1.
Figure 18:
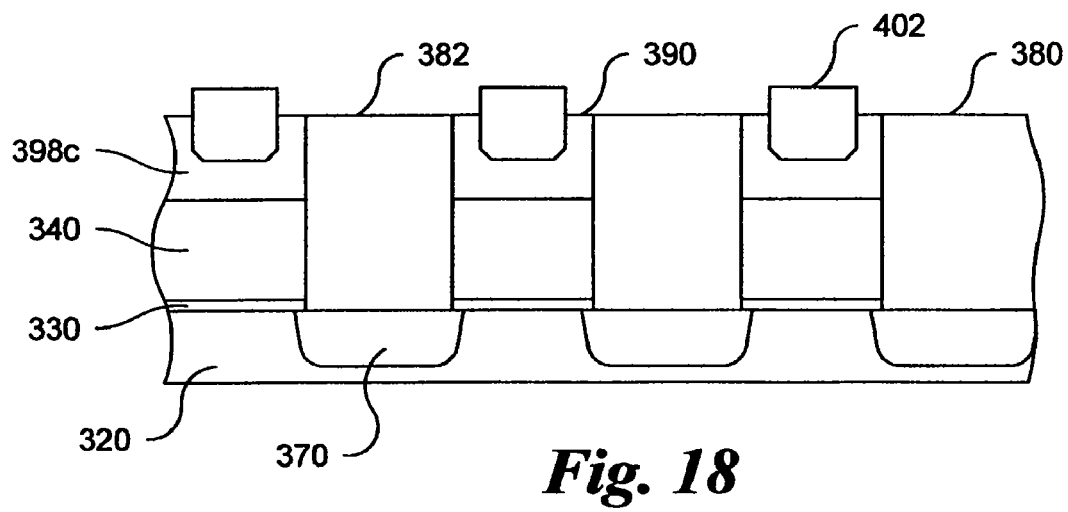
Figure 19:
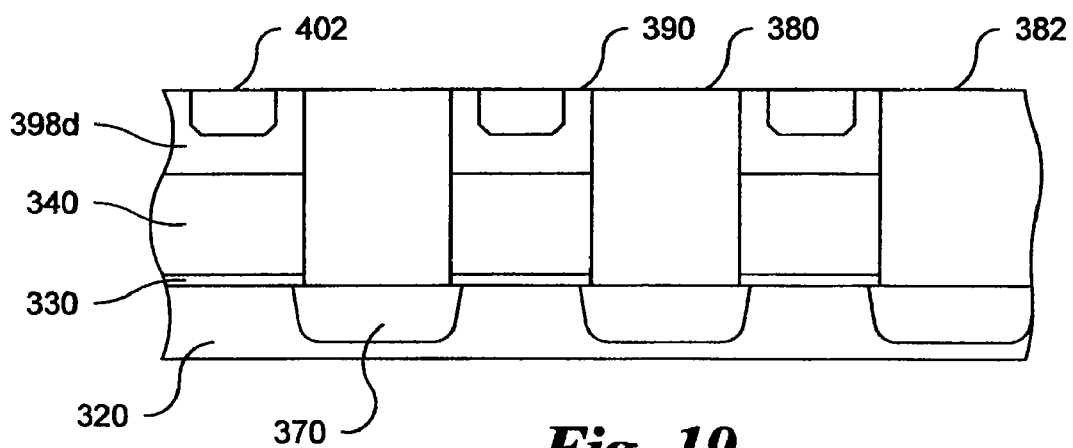
FIG. 19 is a schematic cross-sectional view of a flash memory device undergoing a manufacturing step in accordance with a fourth variation of the method of FIG. 1.
Figure 20:
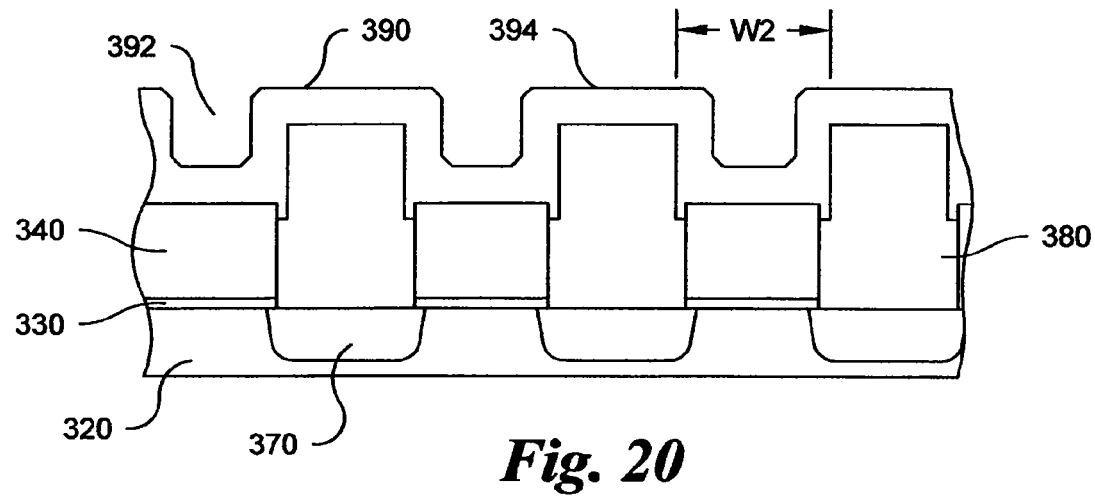
FIGS. 20-25 are schematic cross-sectional views of a flash memory device undergoing a series of progressive manufacturing steps in accordance with a fifth variation of the method of FIG. 1.
Figure 21:
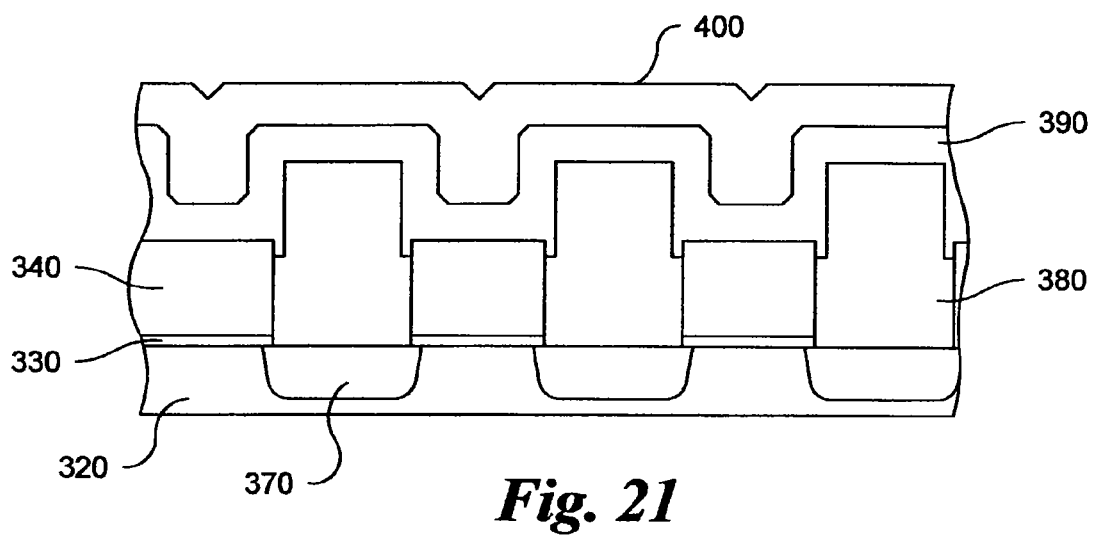
Figure 22:
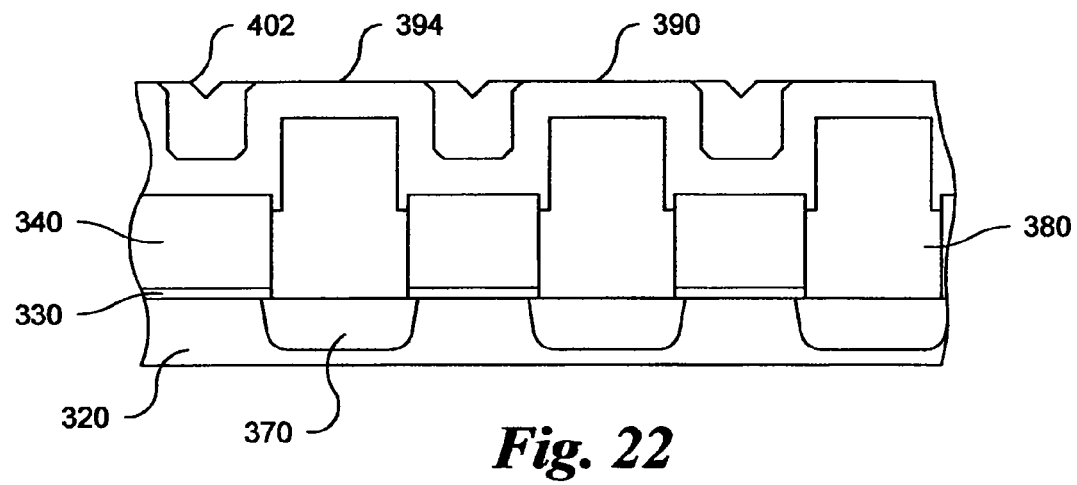

With reference now to FIGS. 1A-1D, 14-16, and 26, a second variation 10b of the method 10 includes first through eleventh steps 20-130 of the first variation 10a. However, in the second variation 10b, the eleventh step 130 follows path 131 to an eighteenth step 170. In eighteenth step 170, a dry, anisotropic etch process is used to remove a portion of the semiconductor spacer layer 390. As the process is anisotropic, as illustrated in FIG. 14, both tops 382 of the buried drain oxide layer 380 are exposed, as well as tops 342 of the first semiconductor layer 340. With reference to FIG. 15, in a nineteenth step 180, an upper portion of the buried drain oxide layer is removed, preferably to a depth sufficient to expose a portion of the first semiconductor layer 340. A semiconductor spacer structure 398b comprising two sides but no base connecting the sides (in contrast to semiconductor spacer layer 398a) is thus formed. As in fifteenth step 190, the gate coupling ratio may be controlled in part by controlling the depth to which the buried drain oxide layer 380 is etched. Finally, with reference to FIGS. 1D and 16, from nineteenth step 180, the process of the second variation 10b proceeds along path 181 to the sixteenth and seventeenth steps 200, 210 of the first variation 10a, thus producing a flash memory device 300 having an enhanced gate coupling ratio.

With reference now to FIGS. 1A-1D, 17, 18, and 26, a third variation 10c of the method 10 includes first through seventeenth steps 20-210 of the first variation 10a. However, in the third variation 10c, the thirteenth step 150 is performed using a conventional polishing process 154 to remove the portion of the oxide layer 400 formed on top of the semiconductor spacer layer 390 to a depth corresponding substantially to the top 394 of the semiconductor spacer layer 390, and leaving the remaining portion 402 of the oxide layer within the plurality of recesses 392. Subsequent to step 150 and process 154, the process of the third variation 10c follows path 151 to step 160. Steps of the third variation 10c subsequent to process 154 are the same as the fourteenth through seventeenth steps 160-210 of the first variation 10a (including step 160 illustrated in FIG. 18).

With reference now to FIGS. 1A-1D, 19, and 26, a fourth variation 10d of the method 10 like the third variation 10c also includes first through seventeenth steps 20-210 of the first variation 10a. Similar to the third variation 10c, in the fourth variation 10d, the thirteenth step 150 is performed using a conventional polishing process 156 to remove the semiconductor spacer layer 390. However, the polishing process 156 is performed to a depth corresponding substantially to the tops 382 of the buried drain oxide layer 380. Subsequent to step 150 and process 156, the process of fourth variation 10d follows path 158 to step 190. Steps of the fourth variation 10d subsequent to process 156 are the same as the fifteenth through seventeenth steps 190-210 of the first variation 10a.

Figure 23:
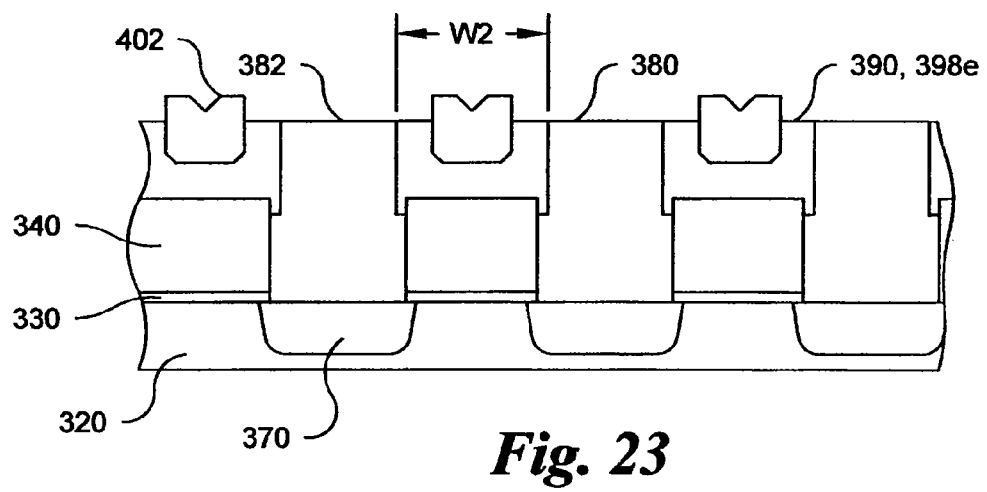
Figure 24:
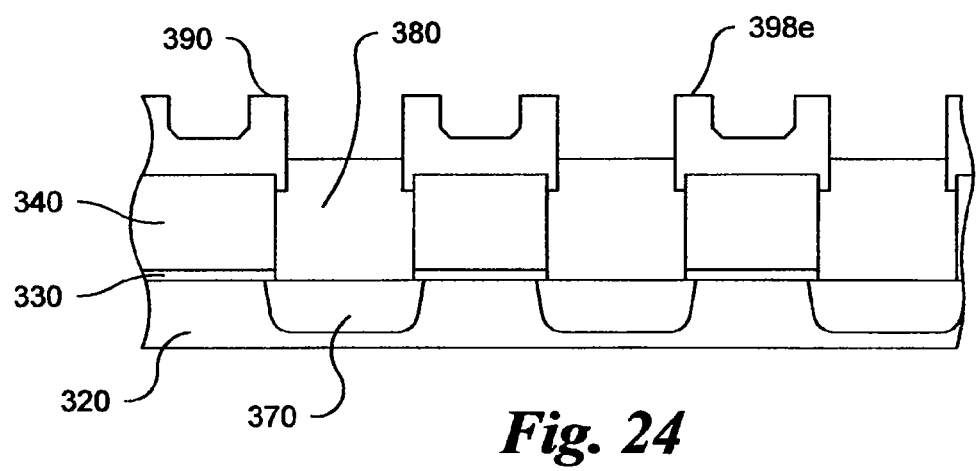
Figure 25:
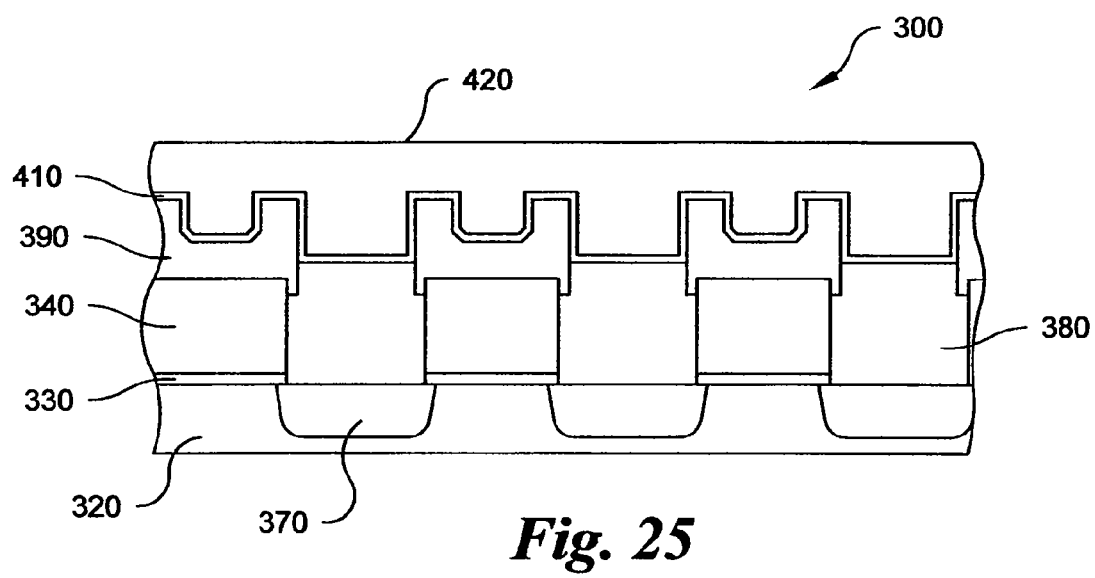

With reference now to FIGS. 1A-1D and 20-26, a fifth variation 10e of the method 10 includes first through tenth steps 20-110 of the first variation 10a. However, the process of the fifth variation 10e follows path 112 to a twentieth step 120. In twentieth step 120, an exterior surface of each of the mesas of the buried drain oxide layers 380 is removed, preferably by a native oxide removal process. The twentieth step 120 is followed by eleventh through seventeenth steps 130-210 to form the flash memory device 300, and FIGS. 21 through 25 reflect steps 140 (FIG. 21), 150 (FIG. 22, using process 152), 160 (FIG. 23), 190 (FIG. 24, using process 190b), and steps 200 and 210 (FIG. 25). With particular reference to FIG. 23, following fourteenth step 160, the resulting semiconductor spacer structures 398e each have a width W2. The width W2 is larger than the width W1 associated with first through fourth variations 10a-10d. A resulting spacer structure 398e is larger, and has more surface area, than the spacer structure 398a-398d associated with the first through fourth variations 10a-10d, respectively. Owing to the twentieth step 120, the width W2 is larger than a width of the buried drain oxide layer mesa, and also larger than a spacing between adjacent buried drains 370. Thus, the semiconductor spacer structure 398e is made wider (and the contact area between the semiconductor spacer structure 398e (part of the floating gate) and the second semiconductor layer 420 (the control gate) is increased) without affecting spacing between adjacent buried drains 370. In the fifth variation 10e, removal of the buried drain oxide layers in fifteenth step 190 is preferably performed using process 190b, to etch the buried drain oxide layers to a depth less than upper surfaces 342 of the first semiconductor layer 340.

FIG. 26 is provided to assist the reader in understanding the relationship among the variations 10a-10e of the method 10.

A method of manufacturing a flash memory device is thus disclosed. The method of providing flash memory devices having enhanced gate coupling ratios providing greater processing flexibility and without requiring reduction of buried drain semiconductor space.

It will be appreciated by those skilled in the art that changes could be made to the embodiment described above without departing from the broad inventive concept thereof. It is understood, therefore, that this invention is not limited to the particular embodiment disclosed, but it is intended to cover modifications within the spirit and scope of the present invention.

We claim:

1. A method of manufacturing a memory device, comprising:
    providing a semiconductor substrate;
    forming a dielectric layer on the semiconductor substrate;
    forming a first semiconductor layer including a plurality of separate parts, comprising:
        forming an unpatterned semiconductor layer on the dielectric layer;
        forming an insulating layer on the unpatterned semiconductor layer; and
        patterning the insulating layer and the unpatterned semiconductor layer to form the separate parts of the first semiconductor layer;
    forming a buried drains in the substrate;
    forming a buried drain oxide mesas between the separate parts of the first semiconductor layer, each buried drain oxide mesa positioned over one of the buried drains, and each buried drain oxide mesa having an upper surface extending above upper surfaces of the separate parts of the first semiconductor layer;
    removing the patterned insulating layer to expose the upper surfaces of the plurality of the separate parts of the first semiconductor layer; and
    forming a plurality of U-shaped semiconductor structures, each being right above and in electrical connection with one of the plurality of separate parts of the first semiconductor layer to form a floating gate, comprising:
        forming a second semiconductor layer covering the plurality of the separate parts of the first semiconductor layer, wherein the second semiconductor layer has a plurality of recesses therein, each recess in the plurality of recesses being right above one of the plurality of the separate parts of the first semiconductor layer, and the second semiconductor layer covers the upper surfaces of the buried drain oxide mesas;
        forming an oxide layer on top of the second semiconductor layer, wherein the oxide layer has a sufficient thickness such that each of the plurality of recesses is filled up;
        removing a plurality of portions of the oxide layer and a plurality of non-recess portions of the second semiconductor layer, comprising:
            removing the plurality of portions of the oxide layer to expose the plurality of the non-recess portions of the second semiconductor layer; and
            removing the plurality of the non-recess portions of the second semiconductor layer to expose the upper surfaces of the buried drain oxide mesas and form a second plurality of separate parts of the second semiconductor layer, and
        removing all remaining portions of the oxide layer to expose an interior surface of each of the plurality of the U-shaped semiconductor structures, wherein a portion of each of the buried drain oxide mesas is also removed to expose a portion of each of the separate parts of the first semiconductor layer.

2. The method of manufacturing the memory device of claim 1, further comprising:
    forming an insulating stacked structure on exposed portions of the buried drain oxide mesas, the plurality of the separate parts of the first semiconductor layer and the second plurality of separate parts of the second semiconductor layer; and
    forming a third semiconductor layer on the insulating stacked structure.

3. The method of manufacturing the memory device of claim 2, wherein the third semiconductor layer forms a control gate.

4. The method of manufacturing the memory device of claim 2, wherein the first semiconductor layer, the second semiconductor layer and the third semiconductor layer are each formed from polysilicon.

5. The method of manufacturing the memory device of claim 2, wherein the insulating stacked structure is an oxide-nitride-oxide structure.

6. The method of manufacturing the memory device of claim 1, further comprising a step of removing an exterior portion of each of the buried drain oxide mesas prior to the step of forming the second semiconductor layer covering the separate parts of the first semiconductor layer and the upper surfaces of the buried drain oxide mesas.

7. The method of manufacturing the memory device of claim 6, wherein the step of removing the exterior portion of each of the buried drain oxide mesas is performed using a cleaning process.

8. The method of manufacturing the memory device of claim 1, wherein the step of removing the portions of the oxide layer to expose the plurality of the non-recess portions of the second semiconductor layer is performed using a polishing process.

9. The method of manufacturing the memory device of claim 8, wherein the polishing process removes the oxide layer down to the second semiconductor layer.

10. The method of manufacturing the memory device of claim 1, wherein the insulating layer is formed from silicon nitride.

11. The method of manufacturing the memory device of claim 1, wherein the dielectric layer is formed from silicon dioxide.

12. The method of manufacturing the memory device of claim 1, wherein the step of patterning the insulating layer and the unpatterned semiconductor layer to form the separate parts of the first semiconductor layer comprises an etching process through which portions of the dielectric layer are exposed.

13. The method of manufacturing the memory device of claim 1, wherein the step of removing the plurality of the non-recess portions of the second semiconductor layer is performed using an etching process.

14. The method of manufacturing the memory device of claim 1, wherein the step of removing the portions of the oxide layer to expose the plurality of the non-recess portions of the second semiconductor layer and the step of removing the plurality of the non-recess portions of the second semiconductor layer to expose the upper surfaces of the buried drain oxide mesas are each performed using an etching process.

15. The method of manufacturing the memory device of claim 1, wherein the step of removing the portions of the oxide layer to expose the plurality of the non-recess portions of the second semiconductor layer and the step of removing the plurality of the non-recess portions of the second semiconductor layer to expose the upper surfaces of the buried drain oxide mesas are each performed using a polishing process.

16. The method of manufacturing the memory device of claim 1, wherein the step of removing all remaining portions of the oxide layer and the portion of each of the buried drain oxide mesas is controlled to remove a predetermined amount of each of the buried drain oxide mesas to a predetermined depth to obtain a predetermined gate coupling ratio.

17. The method of manufacturing the memory device of claim 1, wherein one of the separate parts of the first semiconductor layer and one of the separate parts of the second semiconductor layer together form a floating gate.

18. The method of manufacturing the memory device of claim 1, wherein patterning the insulating layer comprises:
    forming a photoresist layer on top of the insulating layer;
    patterning the photoresist layer; and
    using the patterned photoresist layer as an etch mask for an etching process to remove portions of the insulating layer.

19. The method of manufacturing the memory device of claim 1, wherein the step of forming the buried drain oxide mesas is performed using a deposition process.

20. The method of manufacturing the memory device of claim 1, wherein the step of forming the buried drain oxide mesas between the separate parts of the first semiconductor layer comprises:
    forming a buried drain oxide layer covering the dielectric layer, the patterned insulating layer, and the separate parts of the first semiconductor layer; and
    polishing the buried drain oxide layer and the patterned insulating layer using a chemical-mechanical-polishing planarization technique.

\* \* \* \* \*